United States Patent [19]
Swift et al.

[11] Patent Number: 5,462,773
[45] Date of Patent: Oct. 31, 1995

[54] SYNCHRONIZED PROCESS FOR CATALYSIS OF ELECTROLESS METAL PLATING ON PLASTIC

[75] Inventors: Joseph A. Swift, Ontario; Thomas E. Orlowski, Fairport, both of N.Y.

[73] Assignee: Xerox Corporation, Stamford, Conn.

[21] Appl. No.: 996,990

[22] Filed: Dec. 28, 1992

[51] Int. Cl.[6] ............................................. B05D 1/18
[52] U.S. Cl. ..................... 427/555; 427/123; 427/209; 427/301; 427/306; 427/443.1
[58] Field of Search ........................... 427/123, 555, 427/301, 306, 443.1; 428/209

[56] References Cited

U.S. PATENT DOCUMENTS

| | | | |
|---|---|---|---|
| 4,228,213 | 10/1980 | Beckenbaugh | 428/209 |
| 4,302,511 | 11/1981 | Tuller et al. | 428/412 |
| 4,496,607 | 1/1985 | Mathias | 427/53.1 |
| 4,639,378 | 1/1987 | Inoue | 427/35 |
| 4,659,587 | 4/1987 | Imura et al. | 427/35 |
| 4,681,774 | 7/1987 | Halliwell | 427/443.1 |
| 4,745,006 | 5/1988 | Mohajer | 427/222 |
| 4,804,815 | 2/1989 | Everett | 219/121.6 |
| 4,859,496 | 8/1989 | Toyonaga et al. | 427/53.1 |
| 5,153,023 | 10/1992 | Orlowski et al. | 427/555 |

FOREIGN PATENT DOCUMENTS

| | | | |
|---|---|---|---|
| 0260516 | 3/1988 | European Pat. Off. | C23C 18/16 |
| 0489411 | 6/1992 | European Pat. Off. | C23C 18/18 |
| 1047695 | 3/1986 | Japan | 427/555 |
| 61-96097 | 5/1986 | Japan | C25D 5/02 |
| 64-87767 | 3/1989 | Japan | C23C 14/28 |

*Primary Examiner*—Benjamin Utech

[57] ABSTRACT

A method of forming at least one electrically conductive path in a thermoplastic substrate having a melting point below 325° C., by synchronously depositing on the substrate in the predetermined pattern of said conductive path from an atomized stream of a precursor of a catalyst for the electroless deposition of conductive metals and locally heating the deposited precursor in the pattern corresponding to the conductive path, the catalyst precursor having a decomposition temperature below the melting point of the thermoplastic and within the temperature range where the thermoplastic softens, heating the portion of the thermoplastic substrate corresponding to said conductive path to a temperature sufficient to decompose said catalyst precursor to the catalyst and soften the thermoplastic; said substrate, catalyst precursor and temperature being selected such that on heating to the temperature the precursor decomposes to the catalyst, the thermoplastic softens and at least partially melts without substantial decomposition to enable the catalyst to penetrate the surface of the thermoplastic and become anchored thereto to provide nucleation sites for the subsequent electroless deposition of conductive metal and depositing conductive metal by electroless deposition on the heated portion to form the conductive path.

22 Claims, 5 Drawing Sheets

SYNCHRONIZED PROCESS FOR CATALYSIS OF ELECTROLESS METAL PLATING ON PLASTIC

BACKGROUND OF THE INVENTION

The present invention relates generally to electrical components and methods for making electrical components, and in particular, it is directed to electrical components having an electrically conductive path in a thermoplastic substrate formed by the electroless deposition of the conductive metals on a path or pattern of nucleation sites of catalyst for the electroless deposition of conductive metals anchored in the thermoplastic. More specifically, the electrical component may be a planar member, a two-sided circuit board, or a frame or structural member in a machine such as automatic reprographic machines, including office copiers, duplicators and printers. In a typical electrostatographic reproducing machine, a photoconductive insulating member is uniformly charged and exposed to a light image which discharges the exposed or background areas and creates an electrostatic latent image on the member corresponding to the image contained within the original document. Alternatively, a light beam such as a laser beam may be modulated and used to selectively discharge portions of the photoconductive surface to record the desired information thereon. The electrostatic latent image is made visible by developing the image with developer powder referred to in the art as toner which may be subsequently transferred to a support surface such as paper to which it may be permanently affixed by the application of heat and pressure.

In commercial applications of such products, it is necessary to distribute power and/or logic signals to various sites within the machine. Traditionally, this has taken the form of utilizing conventional wires and wiring harnesses in each machine to distribute power and logic signals to the various functional elements in an automated machine. While the conventional approach has been immensely effective in producing convenience products, with increasing demands on manufacturing cost and the desire for automated assembly, different approaches have to be provided. For example, since individual wires and wiring harnesses are inherently very flexible, they do not lend themselves to automated assembly such as with the use of robotics. Furthermore, such harnesses may have to be handled or moved several times to make all connections required. This is a highly labor intensive task, frequently requiring routing of the several harnesses through channels and around components manually with the final connections being also accomplished manually, thereby resulting in potential human error in the assembly. The potential for human error is reduced with the use of automated and in particular robotic assembly. In addition to the relatively high labor costs associated with harness construction and installation of electrical wiring harnesses it is well to note that they are less than totally reliable in producing their intended function. Furthermore, and with increasing sophistication of the capabilities of such products, a plurality of wiring harnesses may be required in any individual machine which can require a large volume of space thereby increasing the overall size of the machine. Accordingly, there is a desire to provide an alternative to the conventional wiring and wiring harnesses that overcomes these difficulties.

U.S. Pat. No. 5,153,023 to Orlowski et al. and commonly assigned to the assignee of the present invention describes a method of forming an electrically conductive path in a plastic substrate by providing a thermoplastic substrate having a melting point below 325° C., coating the substrate with a precursor of a catalyst for the electroless deposition of conductive metals, the catalyst having a decomposition temperature below the melting point of the thermoplastic and within the range where the thermoplastic softens and heating such as by exposure to a laser beam that portion of the coated thermoplastic substrate corresponding to the conductive path to a temperature sufficient to decompose the catalyst precursor to the catalyst and soften the thermoplastic. The substrate catalyst precursor and temperature are selected such that on heating to the temperature at which the precursor decomposes to the catalyst, the thermoplastic softens and at least partially melts without substantial decomposition to enable the catalyst to penetrate the surface of the thermoplastic and become anchored thereto to provide nucleation sites for the subsequent electroless deposition of conductive metal and depositing conductive metal by electroless deposition on said portion to form the conductive path. Subsequently, the unexposed or unheated portions of the coating on the substrate may be removed by washing with a solvent for the precursor of the catalyst.

While capable of forming electrically conductive paths and capable of being automated this process is relatively complicated having several steps in that the substrate must be first overall coated with a solution to provide a uniform coating of catalyst precursor on the entire surface followed by the step of drying the solution to form the coating of the catalyst precursor and finally after heating or exposure to the laser beam removal by washing of the remaining coating of catalyst precursor from the surface of the substrate. Coating the entire substrate with precursor followed by subsequent removal of remaining coating invariably results in the waste of some catalyst precursor material. In addition, in certain situations the solvent tends to interact with certain plastics attacking and dissolving them forming surface step formations which impact the subsequent plating operation. Furthermore, if the catalyst precursor is present on the surface of the thermoplastic substrate for any significant period of time before exposure it becomes more difficult to remove the unexposed precursor following the formation of the conductive path since it is believed that the precursor is in some way interacting with the thermoplastic substrate such as being reduced to the metal alone.

SUMMARY OF THE INVENTION

Accordingly, there is a need for a simplified process to provide an electrically conductive path in a plastic substrate to form an electrical component. More specifically, the surface of a thermoplastic substrate is modified to promote adhesion of the metal to the substrate by synchronously depositing on the substrate in a predetermined pattern of the conductive path an atomized stream of a precursor of a catalyst for the electroless deposition of conductive metals and locally heating the deposited precursor in the predetermined pattern corresponding to the conductive path to enable essentially simultaneous decomposition of a catalyst precursor to the catalyst together with sufficient softening of the thermoplastic surface to enable the catalyst to penetrate the surface of the softened plastic and be anchored in place by the thermoplastic.

In a further principle aspect of the present invention the thermoplastic substrate has a melting point below 325° C., the precursor has a decomposition temperature below the melting point of the thermoplastic and within the range where the thermoplastic softens when heated to a temperature sufficient to decompose the catalyst precursor to the catalyst and soften the thermoplastic substrate to partially melt without substantial decomposition to thereby anchor the catalyst to the substrate to provide nucleation sites for the electroless deposition of conductive metal to form the conductive path.

In a further aspect of the present invention, the coated plastic substrate is heated by directing a laser beam, preferably a focused carbon dioxide laser, to the portion of the substrate corresponding to the conductive path.

In a further aspect of the present invention the width of the laser beam is substantially the same as the width of the deposited catalyst precursor in the conductive path.

In the further aspect of the present invention, the melting point of the thermoplastic substrate is below 300° Centigrade and is within 50°, preferably 30°, of the decomposition temperature of the catalyst precursor.

In the further aspect of the present invention, the thermoplastic substrate is a polyamide, preferably nylon 66 or nylon 6.

In a further aspect of the present invention, the laser beam is directed to the coated thermoplastic substrate in a predetermined pattern comprising a plurality of paths.

In a further aspect of the present invention, the thermoplastic substrate is a three-dimensional member, which is moved relative to the laser beam to create a pattern of catalyst corresponding to the desired conductive path.

In a further aspect of the present invention, the thermoplastic substrate has at least one structural groove therein in a pattern corresponding to the conductive path.

In a further aspect of the present invention, the atomized stream may be that of a solution, a suspension an emulsion or a dry powder.

Other features of the present invention will become apparent as the following description proceeds and upon reference to the drawings.

DESCRIPTION OF THE PREFERRED EMBODIMENT

The invention will now be described with reference to a preferred embodiment of an electrical component and method of making according to the present invention.

In accordance with the present invention a method of making an electrical component having greatly improved adhesion of the conductive metal path pattern or circuit to the substrate is provided which has fewer process steps and saves both process time and material. The process includes the step of synchronously depositing on the thermoplastic substrate in the pattern of a conductive path, a precursor of a catalyst for the electroless deposition of conductive metals and locally heating the deposited precursor in the pattern corresponding to the conductive path. The thermoplastic substrate has a melting point below 325° C. which is heated preferably by exposure to a laser beam to a temperature to decompose the catalyst precursor to the catalyst, soften and at least partially melt without substantial decomposition the thermoplastic substrate to enable the catalyst to penetrate the surface of the substrate and be firmly anchored in place when the plastic is cooled. The catalyst so anchored in the thermoplastic provides nucleation sites for the subsequent electroless deposition of conductive metal to form the conductive path. The component may be a structural or non-structural element and may have a single path or a circuit.

By the term "synchronously depositing and heating" it is intended to define a two step process wherein the heating such as by exposure to a laser beam occurs immediately after deposition of the catalyst precursor. Typically, these two steps which must take place in the stated order, take place within just a few milliseconds, typically less than 10, of one another and therefore can be regarded as being virtually simultaneous.

Figure 1:
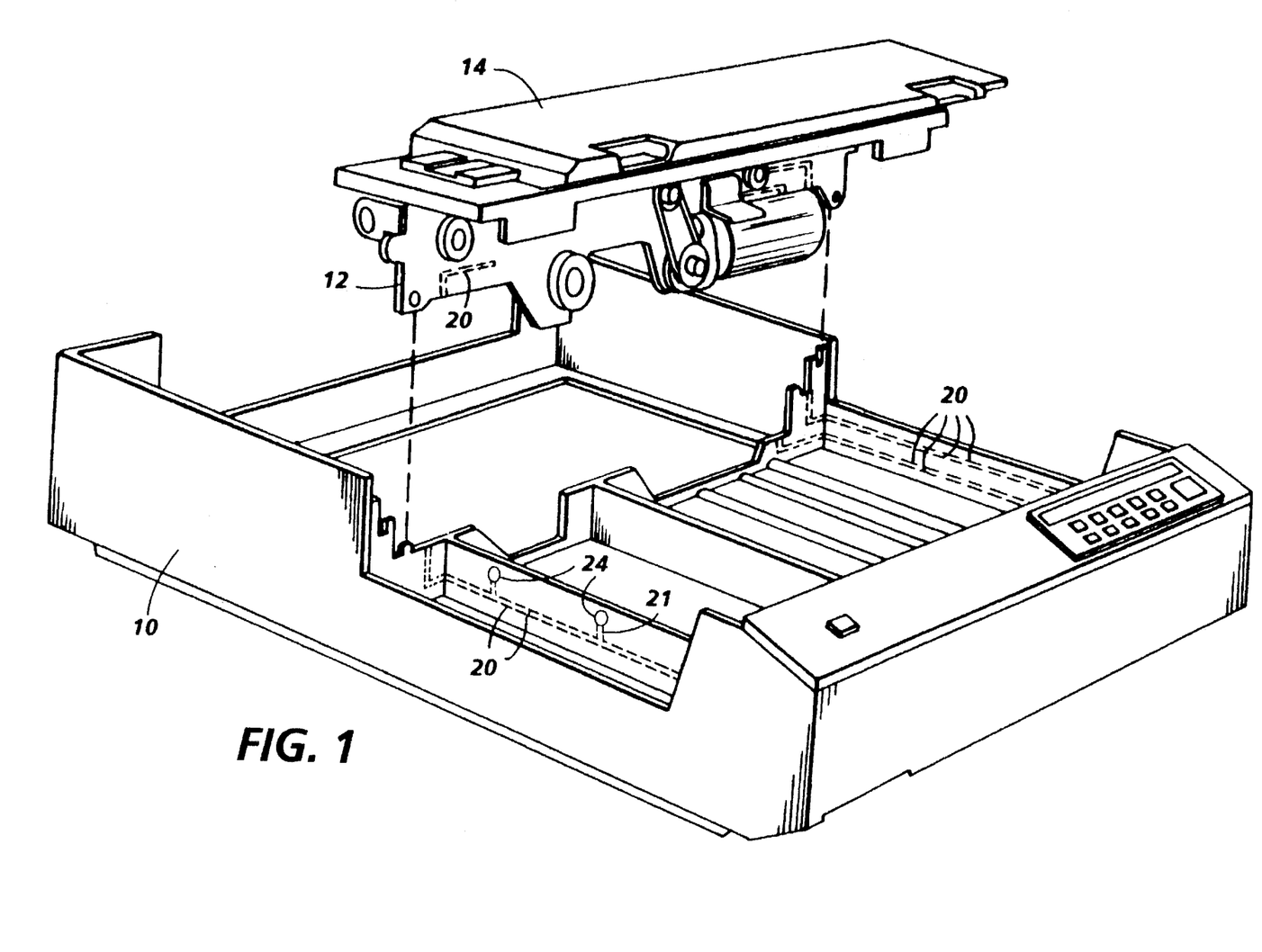
FIG. 1 is an isometric view partially exploded of a portion of the frame section of an electrostatographic printing apparatus with a representative illustration of a circuit pattern formed according to the practice of the present invention.

Referring now to FIGS. 1 and 2, the significance of the present invention will be appreciated. In FIG. 1 a structural frame 10, together with drive module 12 and platen drive module 14, are illustrated as parts of an electrostatographic reproducing apparatus. For further description of the machine elements and its manner of operation, attention is directed to U.S. Pat. No. 4,563,078. Also illustrated are electroconductive paths or traces 20 which may be formed directly into the machine support frame 10 with the technique according to the present invention. Also illustrated are conductive traces 21 and through vias 24.

Figure 2A:
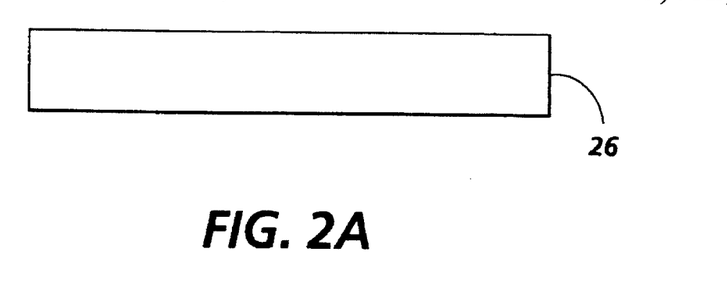
FIGS. 2A, 2B, 2C, 2D are views in cross section of the thermoplastic substrate during different stages in the process of forming the conductive path.

FIGS. 2A to 2D are enlarged cross sectional representations of the electrical component during several stages of its manufacture according to the technique of the present invention. In FIG. 2A the substrate 26 is exposed to ambient condition.

Figure 2B:
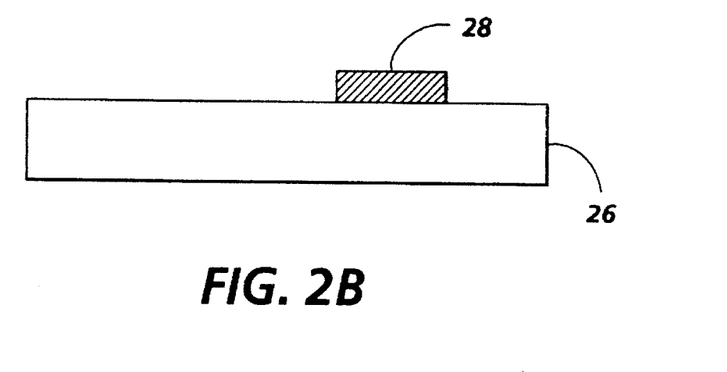

FIG. 2B illustrates the deposition of a catalyst precursor on the thermoplastic substrate 26 in the pattern of the conductive path 28.

Figure 2C:
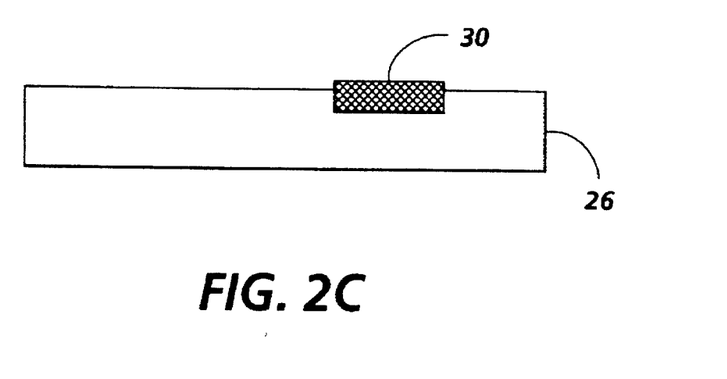

FIG. 2C illustrates the condition of the substrate 26 after it has been exposed to heat typically by exposure to a laser beam which occurs within milliseconds after deposition of the catalyst precursor to decompose the catalyst precursor to volatile gases and catalyst particles 30 which penetrate the surface of a thermoplastic substrate and become anchored thereto as the substrate cools.

Figure 2D:
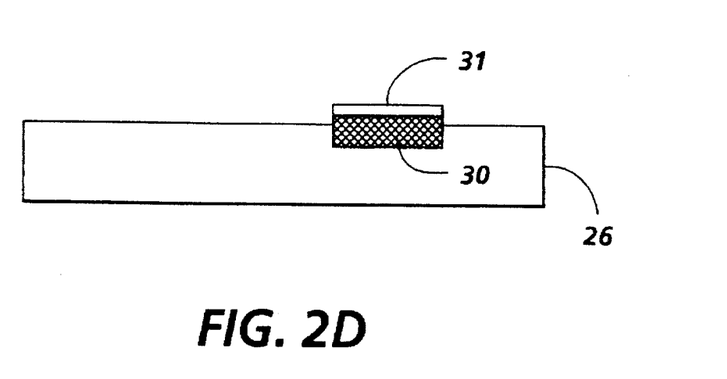

FIG. 2D illustrates the structure including a conductive metal layer 31 which has been electrolessly deposited on the exposed catalyst 30 which is thermally adhered to the plastic substrate 26.

Figure 3:
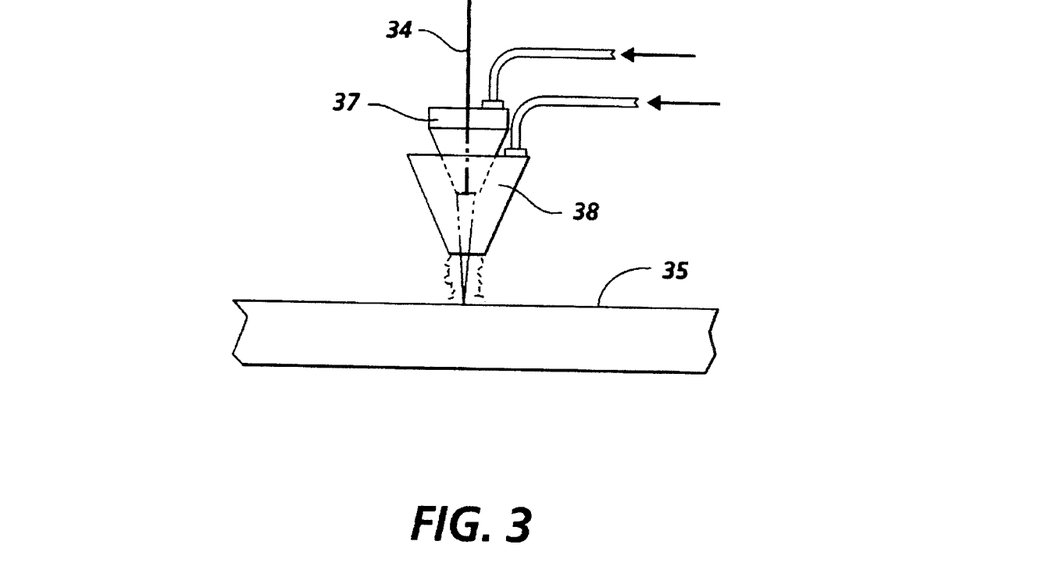
FIG. 3 is a schematic illustration of a simple apparatus that may be used in the practice of the present invention to provide both a sweep gas and an atomized stream of catalyst precursor concentric with the focused laser beam.
Figure 4:
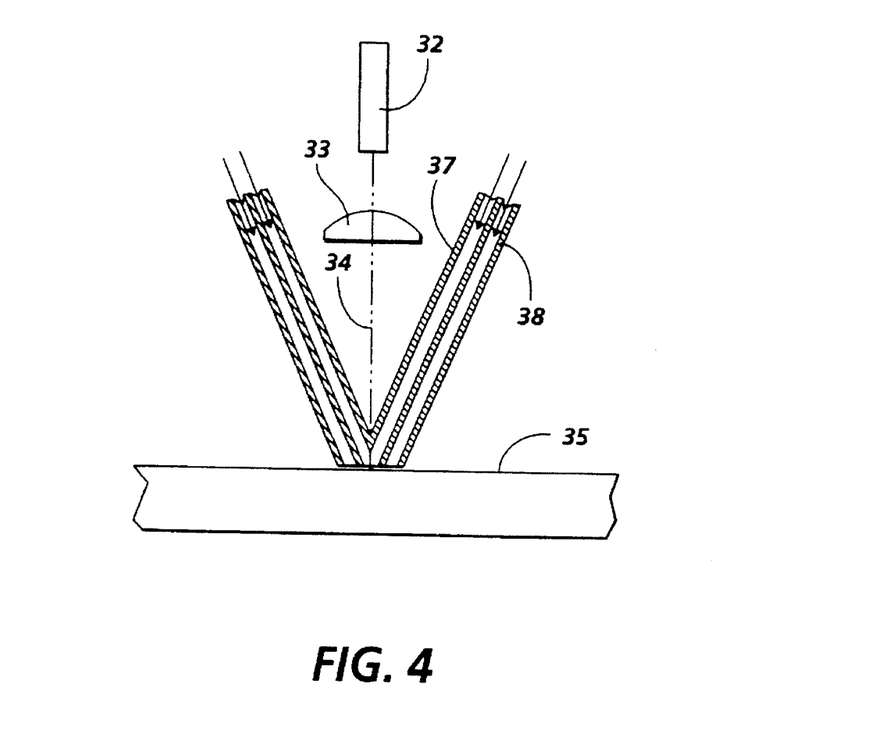
FIG. 4 is an enlarged cross sectional view of the apparatus illustrated in FIG. 3.

Attention is now directed to FIGS. 3 and 4 wherein the method and apparatus useful in the present invention are schematically illustrated. A laser 32 such as a $CO_2$ laser is focused by lens 33 to deliver a focused laser beam 34 at the surface of the workpiece 35. It is common practice to employ "sweep" or "carrier" gases such as argon, helium or nitrogen to continually purge the laser's exit optics during this operation. Typically, a concentrically mounted nozzle 37 around the laser beam delivers the sweep gas at low pressure approximately 5 to 30 psi, thereby keeping small particle contamination, flying debris and condensable gases from reaching the open optics. Delivery of the sweep gas to the optics in this manner also helps to maintain a high quality output beam and minimizes costly unscheduled maintenance. To this system the present invention provides a second gas inlet 38 for the introduction of an atomized stream of catalyst precursor concentric with the sweep gas and the focused laser beam. In its simplest form the apparatus can be considered to be an air brush depositing a catalyst precursor from an atomized stream just ahead of a moving laser beam. This device is effective to form simple patterns and straight lines. However, for the more complicated patterns the nozzle, which in reality is a funnel inside a funnel delivers the atomized stream around the laser in a concentric cone shaped supply of the precursor. Accordingly, no matter which direction the apparatus moves relative to the workpiece the atomized stream of catalyst precursor is always delivered in front of the laser beam and the sweep or carrier gas is always closest to the laser beam and the lens to afford it's protection. In a further embodiment the nozzle surrounding the laser beam may have very small holes, the opening and closing of which is controlled such that the atomized stream of catalyst precursor is only delivered in front of the laser in the process direction.

The use of an atomized stream enables the use of mixtures of materials without having to have a common solvent such as is required in the aforementioned patent. In addition, the atomized stream can be formed at the end of the nozzle from solutions, suspensions, emulsions and even from dry powders of the catalyst precursor. While the catalyst precursor if available in the gaseous phase may be used by bleeding it into the sweep gases this is a relatively slow process. For fast processes, liquid or solid solutions or suspensions are preferred. Furthermore, with the current process, multiple passes of deposition and heating may be made for example around a sharp edge or to ensure complete coating. Typically, the width of the catalyst precursor deposited is greater than that of the width of the laser which is focused to less than 75 to 100 microns so that following the exposure step and cooling any unexposed precursor may be removed from the substrate by washing with a suitable solvent. Accordingly, it is preferred that the width of the catalyst precursor deposited and the width of the laser beam be the same so that there is no catalyst precursor residue that has to be removed.

Any suitable thermoplastic substrate may be used in the practice of the present invention which has a melting point below 325° Centigrade and preferably has a melting point below 300° Centigrade. The catalyst precursors employed in the practice of the present invention typically have thermal decomposition temperatures below about 260° C. and generally in the range of 200°–260° C. We have found that the optimum adhesion is achieved by selecting a thermoplastic having a melting point which is within 50° of the decomposition temperature of the catalyst precursor and preferably is within 30° of the decomposition of the catalyst precursor. This enables the decomposition of the catalyst precursor to volatile materials and catalyst at about the same temperature that the thermoplastic is substantially softened with partial but not substantial melting nor decomposition. This enables the catalyst particles to penetrate the surface of the thermoplastic and become anchored there when the thermoplastic cools. The pressure created by the sweep gas and/or the catalyst precursor delivery system may aid this anchoring function. Typical thermoplastics include the engineering grade plastics such as, polyvinyl chloride, polyphenylene oxide such as Noryl, polycarbonates, ABS, blends of ABS with polycarbonate, polyesters and other plastics and polyamides. The polyamides nylon 66, and nylon 6, are particularly preferred for their superior adhesion properties. If desired, the thermoplastic may be in pure form or can be filled with conventional fillers such as glass fibers and clays or foamed to reduce weight in a conventional manner. In an alternative embodiment, substrates made from thermosetting plastics may be employed when they are precoated with a suitable thermoplastic layer.

The catalyst is typically selected to participate in the electroless deposition of conductive metals by providing nucleation sites for the metals. Typical catalyst precursors having decomposition temperatures between about 200° and 260° Centigrade, include copper acetate, palladium diamine hydroxide, palladium acetate, palladium acetyl acetate, palladium hexa fluroacetylacetate and the platinum analogs of the above palladium compounds. Palladium acetate is particularly preferred because it is commercially available and decomposes cleanly and predictably at one of the lower decomposition temperatures of 220° C. Further, it is soluble in solvents such as acetone and alcohols which are harmless to thermoplastics.

As previously discussed the catalyst precursor is provided to the surface of the thermoplastic substrate in an atomized stream which may come from a solution, suspension, emulsion or dry powder of the precursor. If possible, it is preferred to use an aqueous system for economical as well as environmental reasons. However, organic solvents having the precursor in a concentration of from about 1 to 5% such as acetone, methyl ethyl ketone, ethyl alcohol, methyl alcohol, isopropyl alcohol, butyl alcohol, methyl isobutyl ketone, toluene, ammonia, acetonitrile, chlorobenzene and methyl chloride may be used. The solvent should be selected so that it dissolves the catalyst precursor but does not dissolve or otherwise tacify the thermoplastic substrate. Synchronized with the deposition of the catalyst precursor is the heating of the precursor within just a few milliseconds in the pattern corresponding to the desired conductive trace. This is typically done by a laser which has a wavelength selected such that the thermoplastic substrate can readily absorb. The carbon dioxide laser is particularly preferred as all the standard engineering thermoplastics mentioned above, absorb at its wave length of 10.6 microns. Typically, a low powered 0.1 to 1.0 watt, carbon dioxide laser can be focused to a 100 micron diameter spot scanned across the plastic surface at speeds from 0.5 mm. per second to 5 cm. per second to heat the catalyst precursor to a temperature above the thermal decomposition temperature where precursor is voltalized with gases coming off and the metallic catalyst deposit is left to penetrate the softened and partially melted thermoplastic surface and become anchored in the thermoplastic surface as it cools. As previously discussed above, optimum adhesion is obtained when the difference between the melting point of the thermoplastic and the decomposition temperature of the catalyst precursor is less than 50° Centigrade and preferably less than 30° Centigrade. Following exposure to the laser beam and creation of the anchored catalyst path in the thermoplastic surface any catalyst precursor on the exposed or heated areas may be removed with a solvent, such as the solvent from which the catalyst precursor was originally supplied.

The final step in the formation of the electrical component according to the present invention is the electroless plating of conductive metal, such as, copper or nickel on the catalyst nucleation sites anchored in the thermoplastic substrate. Standard electroless plating techniques from a bath of, for example, copper sulfate for copper plating the catalyzed path are in accordance with the following, generally accepted mechanism:

$$2Cu^{+2} + HCHO + 3OH^- \xrightarrow{Pd} 2Cu^+ + HCOO^- + 2H_2O$$

$$\downarrow$$

$$2Cu^o + Cu^{+2}$$

| | |
|---|---|
| $CuSO_4.5H_2O$ | 25 g/l |
| Sodium gluconate | 60 g/l |
| NaOH | 20 g/l |
| Formaldehyde (37% solution) | 15 ml/l |
| Temperature | 75° F. |

Copper deposits of 30 microinch thickness are typically produced in about 20 minutes. For low power applications this may be sufficient. However in many applications, thickness of up to 1000 microinch may be required. The additional copper thickness is most effectively accomplished by further electrolytically plating in an acid copper sulphate solution under the following conditions:

| | |
|---|---|
| $CuSO_4.5H_2O$ | 250 g/l |
| $H_2SO_4$ | 75 g/l |
| CL- | 40 ppm |
| gelatin | 40 ppm |
| Temperature | 130° F. |
| Current Density | 1 to 10 amps/square decimeter |

Figures 5, 5A, 5B:
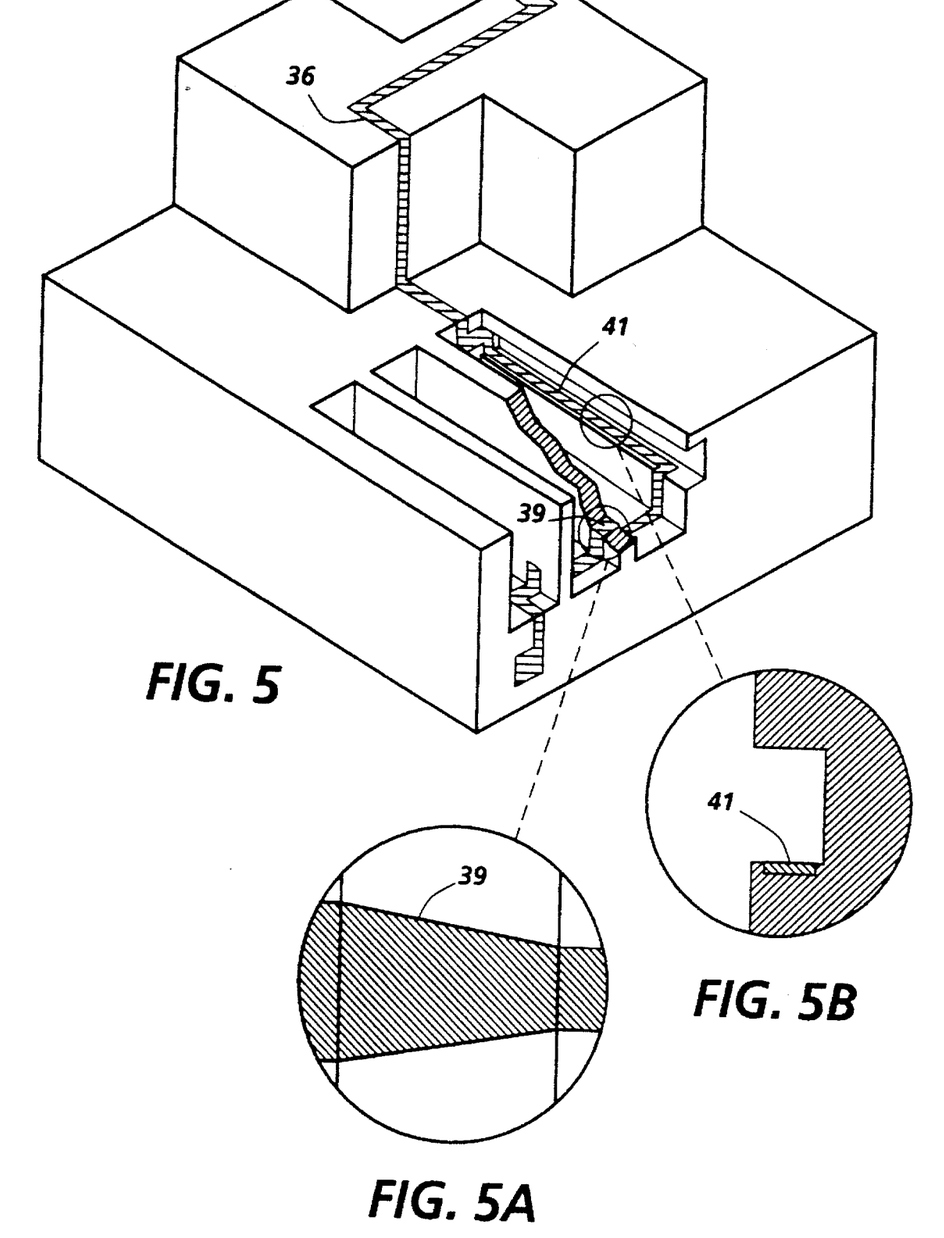
FIG. 5 is an isometric view of a three-dimensional part with enlarged cut away view 5A, illustrating grooves on both sides connected with a via and enlarged cut away view 5B illustrating an electroless pattern in the groove.
Figure 6:
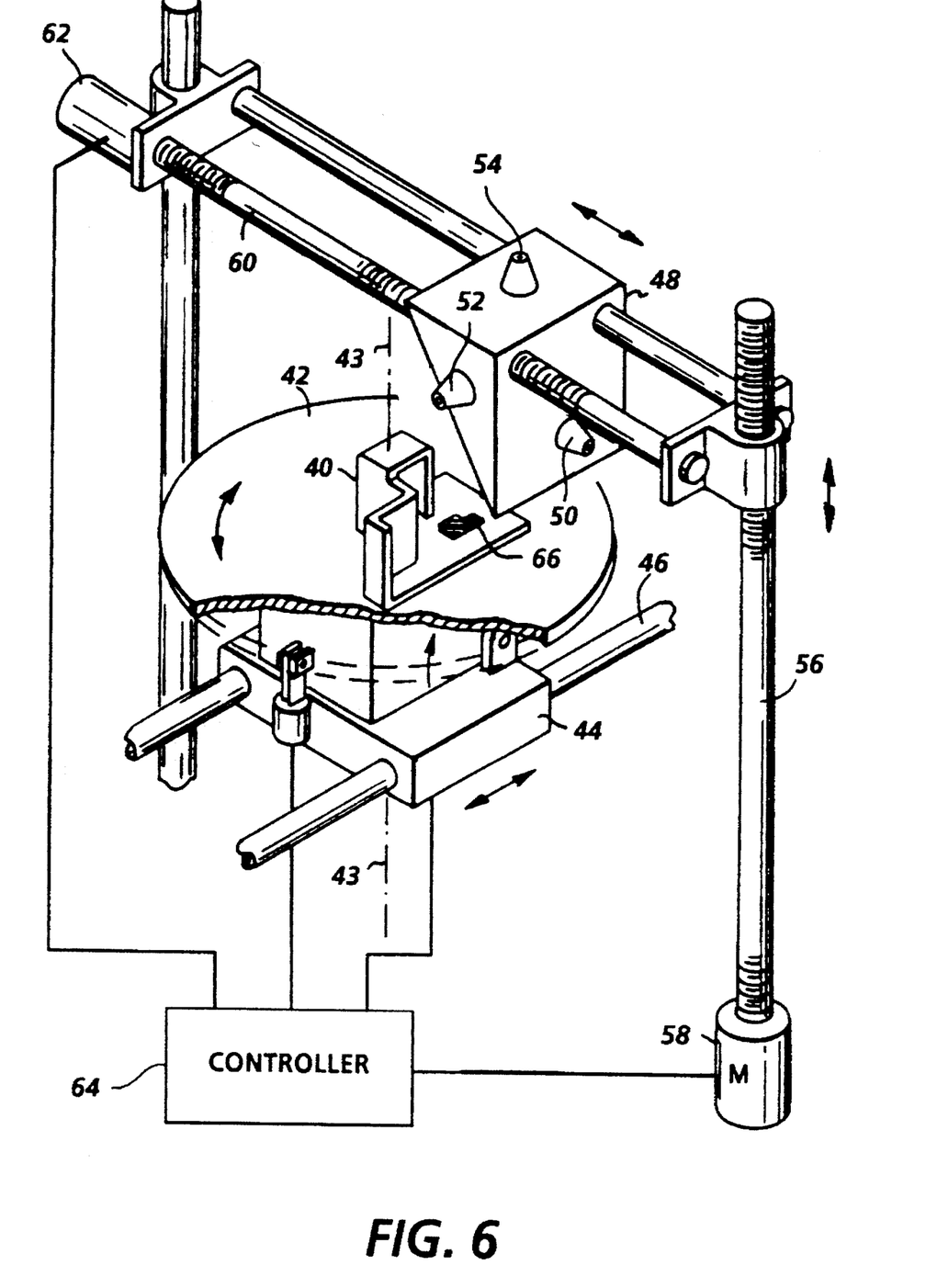
FIG. 6 is a schematic illustration of a system performing the synchronized catalyst precursor deposition and exposure to the laser beam.

Attention is now directed to FIGS. 5 and 6. FIG. 5 illustrates a three dimensional part having a continuous electroless pattern on multiple faces shown to transcend a corner as illustrated by 36. The trace continues down and is illustrated to pass through two vertical walls one of which is shown in enlarged cutaway 5A with via 39. The via of FIG. 5A has a tapered wall configuration from one side to the other side with constantly changing cross section of the passage way, wherein the passage way can taper down from a maximum cross section on one side to a minimum cross section on the other side or alternatively, it can taper down from a maximum cross section at both sides to a minimum cross section between the first and second sides. With this kind of geometry the walls of the via may have the precursor deposited and heated from the side having a maximum cross section or alternatively from both sides to form a catalyst path from one side to the other, whereby during subsequent electroless plating the conductive metal is plated in the via. Enlarged cutaway Figure 5B also illustrates the use of grooves 41 in the thermoplastic substrate as the location of the conductive path thereby providing additional protection for the plated pattern against damage from abrasion.

Attention is directed to FIG. 6 which schematically illustrates a manner in which a plurality of conductive paths representing circuit patterns can be prepared in a part. The part 40 is secured to table 42 which is rotatably mounted about the center axis 43 of a motor shaft (not shown) in the motor box 44. In addition, the table is movable in the XY plane by movement of worm gear 46 by another motor (not shown) in the motor box 44. The laser scanning carriage 48 has three laser ports 50, 52, 54, each with concentrically mounted sweep gas inlet 37 and atomized precursor inlet 38, the assemblies being directed in each direction with the carriage movable vertically by worm gear 56 and motor 58 and horizontally by worm gear 60 and motor 62. The movement of the table 42 and the scanning carriage 48 is controlled by a programmable controller 64 to form the preselected pattern of conductive traces in the part 40. An exhaust hose may be placed adjacent the part being marked to remove any noxious materials produced by the heating.

EXAMPLE

An air brush is moved at a rate of 0.5 mm/sec to deliver an atomized stream of palladium (II) acetate in acetone (less than 50 mg. per ml.) as a catalyst precursor in a single narrow line about one millimeter in width to a thermoplastic substrate of polyvinyl chloride. Immediately following the air brush a focused one millimeter spot diameter carbon dioxide laser beam, 20–25 watts per cm. square with a nitrogen sweep is synchronously scanned along the narrow line of the deposited catalyst precursor to heat the polyvinyl chloride substrate above the thermal decomposition temperature of 220° C. of the palladium acetate to liberate decomposition gases including carbon dioxide and acetic acid and to deposit reduced palladium in a line on the softened surface. Following cooling and hardening the thermoplastic substrate is immersed in a standard commercial copper plating solution for about 15 hours to provide a thick durable bound copper plating of about 25 microns on the line formed by the air brush and laser.

Accordingly, the present invention offers a simple process which avoids the need to coat the entire thermoplastic substrate and subsequently dry it thereby saving process time and since the entire surface of the thermoplastic substrate is not coated it minimizes the amount of material used. In addition, it enables the use of a catalyst precursor in both solid and liquid form and enables the working of mixtures of materials without having to have a common solvent. Indeed, the solid materials may form their own delivery vehicles. Since the deposition of the catalyst precursor and the heating by laser exposure occur synchronously and virtually simultaneously within just a few milliseconds of one another the precursor is fresh so there is no need to worry about the shelf life of the precursor and whether it can be easily removed from the unexposed areas of the substrate. In addition, it permits the use of more aqueous systems of the catalyst precursor thereby eliminating the cost and environmental impact of certain organic solvents.

The disclosure of the patent referred to herein is hereby specifically and totally incorporated herein by reference.

While the invention has been described with specific reference to electrostatographic copier and printer machines it will be appreciated that it has application to a larger array of machines with electrical components. Accordingly, it is intended to embrace all such alternatives and modifications as may fall within the spirit and scope of the appended claims.

We claim:
1. A method of forming at least one electrically conductive path having a pattern in a plastic substrate comprising providing a thermoplastic substrate having a melting point below 325° C., depositing on said substrate in the pattern of said conductive path a catalyst for the electroless deposition of conductive metals by synchronously depositing on said substrate in the pattern of said conductive path an atomized stream of a precursor of the catalyst and locally heating said deposited precursor in the pattern corresponding to said conductive path, said catalyst precursor having a decomposition temperature below the melting point of said thermoplastic and within the temperature range where said thermoplastic softens, heating the portion of said thermoplastic substrate corresponding to said conductive path to a tem- perature sufficient to decompose said catalyst precursor to said catalyst and soften said thermoplastic; said substrate, catalyst precursor and temperature being selected such that on heating to the temperature the precursor decomposes to the catalyst, the thermoplastic softens and at least partially melts without substantial decomposition to enable the catalyst to penetrate the surface of the thermoplastic and become anchored thereto to provide nucleation sites for the subsequent electroless deposition of conductive metal and depositing conductive metal by electroless deposition on said heated portion to form said conductive path.

2. The method of claim 1 wherein said heating comprises directing a laser beam to the portion of the substrate corresponding to said conductive path.

3. The method of claim 2 wherein said laser beam is from a focused carbon dioxide laser.

4. The method of claim 2 wherein said deposition from said atomized stream is in front of said laser beam.

5. The method of claim 2 including the step of delivering a sweep gas to said substrate before directing said laser beam.

6. The method of claim 2 wherein said coated thermoplastic substrate is a three dimensional member and including the step of moving said substrate and said laser beam relative to each other to create a pattern of catalyst corresponding to said conductive path.

7. The method of claim 2 wherein the width of said laser beam is substantially the same as the width of said deposited catalyst precursor in said conductive path.

8. The method of claim 1 wherein the melting point of the thermoplastic substrate is below 300° C.

9. The method of claim 1 wherein the melting point of the thermoplastic substrate is within 50° C. of the decomposition temperature of the catalyst precursor.

10. The method of claim 9 wherein the melting point of the thermoplastic substrate is within 30° C. of the decomposition temperature of the catalyst precursor.

11. The method of claim 9 including the step of removing any deposited catalyst precursor from the unheated areas of the thermoplastic substrate before the electroless deposition step.

12. The method of claim 11 wherein any deposited catalyst precursor is removed from the unheated areas of the thermoplastic substrate by rinsing with a solvent to dissolve the catalyst precursor, said solvent wetting but not dissolving the thermoplastic.

13. The method of claim 1 wherein said heating occurs within 10 milliseconds of said deposition.

14. The method of claim 1 wherein said atomized stream is of an aqueous system.

15. The method of claim 1 wherein a portion of said conductive path is formed from multiple synchronous deposition and heating steps.

16. The method of claim 1 wherein the thermoplastic substrate is a polyamide.

17. The method of claim 1 wherein said catalyst precursor is applied to the thermoplastic substrate from an atomized solvent solution the solvent of which wets but does not dissolve the thermoplastic.

18. The method of claim 1 wherein said catalyst precursor is selected from the group consisting of copper acetate, palladium diamine hydroxide, palladium acetate, palladium acetylacetate and, palladium hexafluoroacetylacetate.

19. The method of claim 18 wherein said catalyst precursor is palladium acetate.

20. The method of claim 19 wherein the palladium acetate is applied to the substrate from an atomized acetone solution thereof and said conductive metal is copper.

21. The method of claim 1 wherein said pattern comprises a plurality of paths.

22. The method of claim 1 wherein said thermoplastic substrate has at least one structural groove therein, in a pattern corresponding to said conductive path.

* * * * *